United States Patent
Lee et al.

(10) Patent No.: US 6,835,649 B2
(45) Date of Patent: Dec. 28, 2004

(54) TUNGSTEN PLUG WITH CONDUCTOR CAPPING LAYER

(75) Inventors: Wei-Cheng Lee, Taipei (TW); Wen-Chen Chien, Taipei (TW); Yu-Da Fan, Taipei (TW); Kuo-Yen Liu, Taipei (TW); Yu-Ching Chang, Hsichu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/161,570

(22) Filed: Jun. 3, 2002

(65) Prior Publication Data

US 2003/0224598 A1 Dec. 4, 2003

(51) Int. Cl.[7] .................... H01L 21/4763; H01L 21/44; H01L 23/48
(52) U.S. Cl. ................ 438/629; 438/631; 438/672; 257/752; 257/763
(58) Field of Search ................. 438/629, 672, 438/675, 627, 628, 631, 643, 653, 654; 257/752, 763, 764

(56) References Cited

U.S. PATENT DOCUMENTS

| | | | |
|---|---|---|---|
| 5,654,234 A | | 8/1997 | Shih et al. |
| 5,672,914 A | | 9/1997 | Huang et al. |
| 5,747,379 A | | 5/1998 | Huang et al. |
| 5,874,355 A | | 2/1999 | Huang et al. |
| 5,895,268 A | * | 4/1999 | Mathews ............... 438/672 |
| 6,221,754 B1 | * | 4/2001 | Chiou et al. ............ 438/619 |
| 6,537,912 B1 | * | 3/2003 | Agarwal ................ 438/687 |
| 6,635,528 B2 | * | 10/2003 | Gilbert et al. ........... 438/253 |

* cited by examiner

*Primary Examiner*—Matthew Smith
*Assistant Examiner*—Lex H. Malsawma
(74) *Attorney, Agent, or Firm*—Tung & Associates

(57) ABSTRACT

Within a method for forming a microelectronic fabrication there is provided a substrate having formed thereover a patterned dielectric layer which defines a via. There is also formed within a lower portion of the via a tungsten stud layer having a recess thereabove within the via. There is also formed within the recess a patterned conductor capping layer formed of a conductor material other than tungsten. The patterned conductor capping layer may seal a void formed within the tungsten stud layer.

9 Claims, 2 Drawing Sheets

TUNGSTEN PLUG WITH CONDUCTOR CAPPING LAYER

BACKGROUND OF THE INVENTION

1. Field of the Invention

The present invention relates generally to tungsten stud layers, as employed within microelectronic fabrications. More particularly, the present invention relates to tungsten stud layers with enhanced reliability, as employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common within the art of microelectronic fabrication to employ when fabricating microelectronic fabrications conductor stud layers for purposes of both: (1) contact to contact regions within microelectronic fabrications; as well as (2) electrical interconnection between electrical interconnection layers within microelectronic fabrications. As is understood by a person skilled in the art, and although conductor stud layers may theoretically be formed from any of several conductor materials as are conventional in microelectronic fabrication, including but not limited to metal, metal alloy, doped polysilicon and polycide conductor materials, a particularly common conductor material for forming conductor stud layers within microelectronic fabrications is a tungsten conductor material. In turn, tungsten conductor materials are desirable for forming conductor stud layers within microelectronic fabrications since tungsten conductor materials are generally less susceptible to electromigration when forming conductor stud layers within microelectronic fabrications.

While conductor stud layers, and in particular tungsten stud layers, are thus desirable in the art of microelectronic fabrication and generally unavoidable in the art of microelectronic fabrication, conductor stud layers, and in particular tungsten stud layers, are nonetheless not entirely without problems in the art of microelectronic fabrication.

In that regard, conductor stud layers are often difficult to form with enhanced reliability within microelectronic fabrications.

It is thus desirable in the art of microelectronic fabrication to form within microelectronic fabrications conductor stud layers with enhanced reliability.

It is towards the foregoing object that the present invention is directed.

Various conductor stud layer structures and methods for fabrication thereof, and in particular tungsten stud layers and methods for fabrication thereof, having desirable properties, have been disclosed in the art of microelectronic fabrication.

Included among the conductor stud layer structures and methods for fabrication thereof, but not limited among the conductor stud layer structures and methods for fabrication thereof, are tungsten stud layer structures and methods for fabrication thereof disclosed within: (1) Shih et al., in U.S. Pat. No. 5,654,234 (a tungsten stud layer structure formed absent a void within a reentrant contact via by employing a two layer tungsten layer deposition method incorporating an anisotropic etchback of a first tungsten layer deposited within the two layer tungsten layer deposition method); (2) Huang et al., in U.S. Pat. No. 5,672,914 (a tungsten stud layer structure formed absent a dimple therein incident to being formed while employing a spin-on-glass (SOG) planarizing and subsequent etchback method); (3) Huang et al., in U.S. Pat. No. 5,747,379 (a tungsten stud layer structure formed absent a seam therein by employing a two layer tungsten layer deposition method incorporating an etchback of a first tungsten layer deposited within the two layer tungsten layer deposition method); and (4) Huang et al., in U.S. Pat. No. 5,874,355 (a tungsten stud layer structure formed absent a volcano shape by nitrogen plasma treating a titanium nitride barrier layer upon which is formed the tungsten stud layer structure).

Desirable in the art of microelectronic fabrication are additional methods and material which may be employed in the art of electronic fabrication for forming conductor stud layers, and in particular tungsten stud layers, with enhanced reliability.

It is towards the foregoing object that the present invention is directed.

SUMMARY OF THE INVENTION

A first object of the present invention is to provide a method for forming a tungsten stud layer within a microelectronic fabrication.

A second object of the present invention is to provide a method in accord with the first object of the present invention, wherein the tungsten stud layer is formed with enhanced reliability.

A third object of the present invention is to provide a method in accord with the first object of the present invention and the second object of the present invention, wherein the method is readily commercially implemented.

In accord with the objects of the present invention, there is provided by the present invention a method for fabricating a microelectronic fabrication, and a microelectronic fabrication fabricated in accord with the method.

To practice the method of the present invention, there is first provided a substrate. There is then formed upon the substrate a patterned dielectric layer which defines a via. There is then formed over the substrate and filling the via a blanket tungsten layer. There is then etched back the blanket tungsten layer to form recessed within the via a tungsten stud layer. There is then formed over the substrate and filling a recess above the tungsten stud layer recessed within the via a blanket conductor capping layer formed of a conductor material other than tungsten. Finally, there is then planarized the blanket conductor capping layer to form within the via a patterned conductor capping layer formed upon the tungsten stud layer.

The method of the present invention contemplates a microelectronic fabrication fabricated in accord with the method of the present invention.

The present invention provides a method for forming a tungsten stud layer within a microelectronic fabrication, wherein the tungsten stud layer is formed with enhanced reliability.

The present invention realizes the foregoing object by forming a tungsten stud layer recessed within a via within a microelectronic fabrication, wherein there is formed upon the tungsten stud layer, and within a recess above the conductor stud layer within the via, a patterned conductor capping layer formed of a conductor capping material other than tungsten. By employing such a patterned conductor capping layer, contaminant materials entrapped within a seam or void formed within the tungsten stud layer may be sealed such as to provide enhanced reliability of the tungsten stud layer and a microelectronic fabrication within which is employed the tungsten stud layer.

The method of the present invention is readily commercially implemented.

The present invention employs methods and materials as are otherwise generally conventional in the art of microelectronic fabrication, but employed within the context of a specific process ordering and specific process limitations to provide a tungsten stud layer in accord with the present invention. Since it is thus at least in part a specific process ordering and a specific series of process limitations which provides at least in part the present invention, rather than the specific existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a tungsten stud layer within a microelectronic fabrication, wherein the tungsten stud layer is formed with enhanced reliability.

The present invention realizes the foregoing object by forming a tungsten stud layer recessed within a via within a dielectric layer within a microelectronic fabrication, wherein there is formed upon the tungsten stud layer, and within a recess within the via above the conductor stud layer, a patterned conductor capping layer formed of a conductor capping material other than tungsten. By employing such a patterned conductor capping layer, contaminant materials entrapped within a seam or void formed within the tungsten stud layer may be sealed such as to provide enhanced reliability of the tungsten stud layer and a microelectronic fabrication within which is employed the tungsten stud layer.

Referring now to FIG. 1 to FIG. 6, there is shown a series of schematic cross-sectional diagrams illustrating the results of forming, in accord with a preferred embodiment of the present invention, a tungsten stud layer within a microelectronic fabrication.

Figure 1:
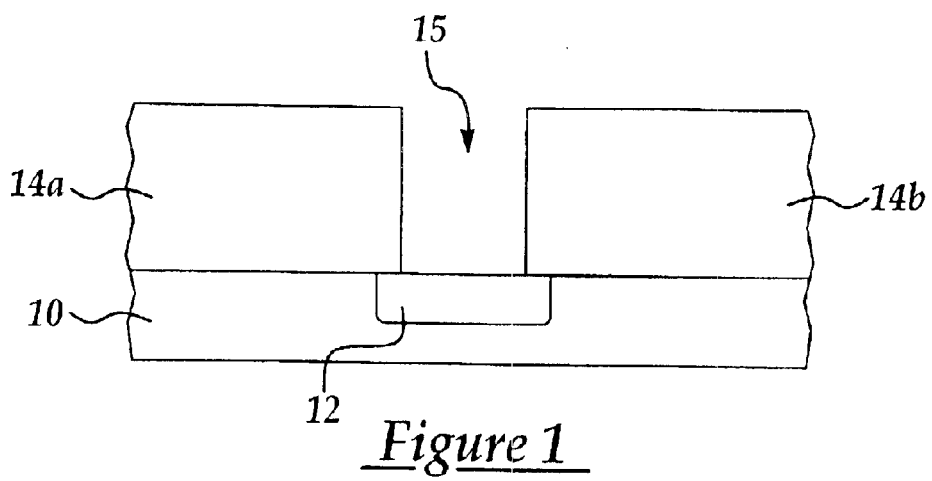
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a tungsten stud layer within a microelectronic fabrication.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in the alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate 10. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, the substrate 10, particularly but not exclusively when the substrate 10 consists of or comprises a semiconductor substrate as employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, resistors, transistors, diodes and capacitors.

Within the preferred embodiment of the present invention with respect to the contact region 12, the contact region 12 is typically and preferably either: (1) a semiconductor contact region, under circumstances where the substrate 10 consists of or comprises a semiconductor substrate; or (2) a conductor contact region (formed from any of several conductor materials) under circumstances where the substrate 10 is employed within any of the above enumerated microelectronic fabrications.

Typically and preferably, the contact region 12 formed within the substrate 10 is formed with bidirectional (i.e., areal) linewidth dimensions.

Finally, there is illustrated within the schematic cross-sectional diagram of FIG. 1 a pair of patterned dielectric layers 14a and 14b which define a via 15 at the bottom of which is exposed a portion of the contact region 12.

Within the preferred embodiment of the present invention with respect to the pair of patterned dielectric layers 14a and 14b, the pair of patterned dielectric layers 14a and 14b may be formed of dielectric materials as are conventional in the art of microelectronic fabrication, including but not limited to: (1) generally higher dielectric constant dielectric materials (such as but not limited to silicon oxide dielectric materials, silicon nitride dielectric materials and silicon oxynitride dielectric materials) having a dielectric constant; as well as (2) generally lower dielectric constant dielectric materials (such as but not limited to spin-on-glass (SOG) dielectric materials, spin-on-polymer (SOP) dielectric materials, fluorosilicate glass (FSG) dielectric materials, amorphous carbon dielectric materials and fluorinated amorphous carbon dielectric materials) having a dielectric constant.

Figure 2:
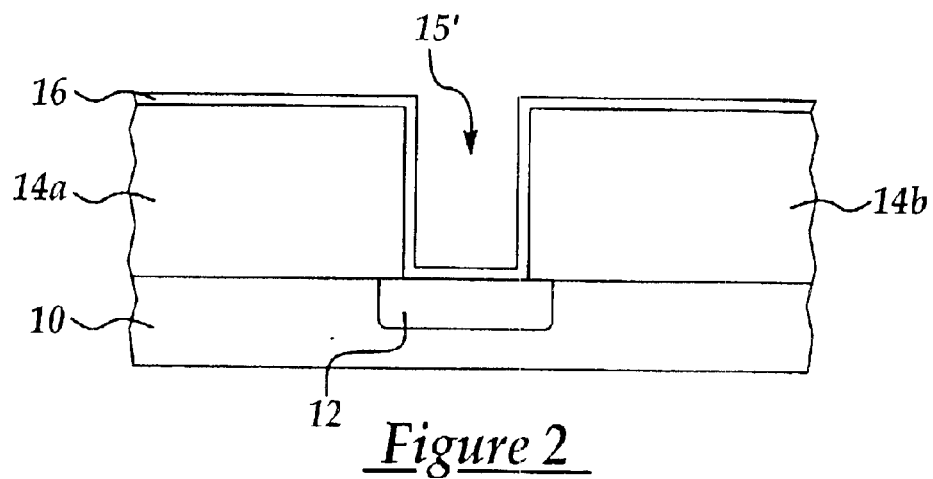

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon exposed portions of: (1) the pair of patterned dielectric layers 14a and 14b; and (2) the contact region 12, while not filling the via 15, a blanket conformal liner layer 16 which in turn provides a partially filled via 15'.

Within the preferred embodiment of the present invention, the blanket conformal liner layer 16 is formed of a conductor liner material which is intended to provide at least one of: (1) adhesion promotion properties; and (2) barrier properties, with respect to a tungsten stud layer subsequently formed upon a patterned conformal liner layer derived from the blanket conformal liner layer 16.

Thus, the blanket conformal liner layer 16 may be formed from any of several conductor liner materials as are conventional in the art of microelectronic fabrication, including but not limited to titanium, titanium nitride, tantalum, tantalum nitride and tungsten nitride liner materials. Similarly, within the present invention, and insofar as it is desirable for the blanket conformal liner layer 16 to minimally fill the via 15 with a single uniform thickness when forming therefrom the partially filled via 15', the blanket conformal liner layer 16 is typically and preferably formed employing a low pressure chemical vapor deposition (LPCVD) method having a deposition pressure, rather than a physical vapor deposition (PVD) method, such as a sputtering method, or a higher pressure chemical vapor deposition (CVD) method. The later two methods typically do not provide deposited layer of conformal (i.e., uniform) thickness.

Within the preferred embodiment of the present invention, the blanket conformal liner layer 16 is typically and preferably formed of a titanium nitride conductor liner material deposited employing a low pressure chemical vapor deposition (CVD) method employing titanium tetrachloride as a titanium source material and ammonia as a nitrogen source material.

Typically and preferably, the blanket conformal liner layer 16 is formed to a thickness of from about 50 to about 120 angstroms.

Figure 3:
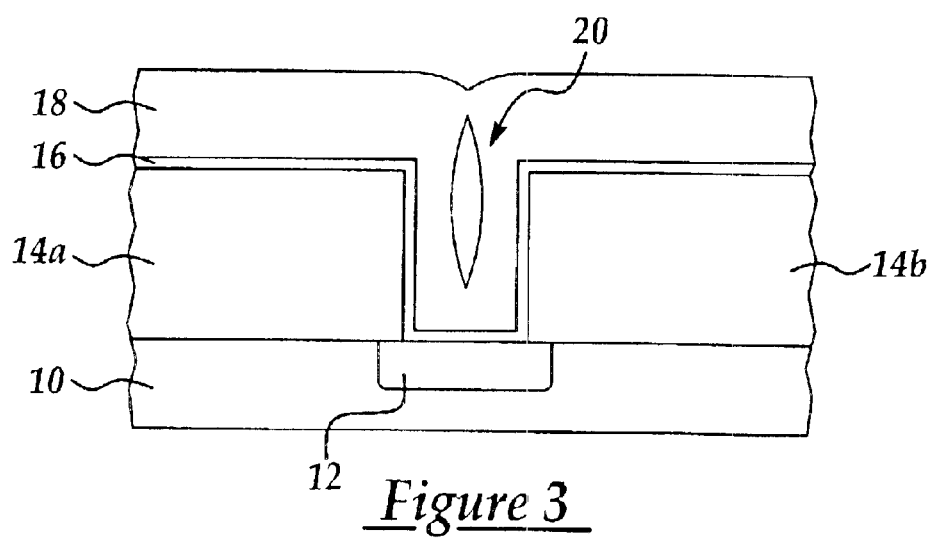

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed upon the blanket conformal liner layer 16 a blanket tungsten layer 18. In turn, and as is also illustrated within the schematic cross-sectional diagram of FIG. 3, the blanket tungsten layer 18 has formed therein a void 20.

Within the preferred embodiment of the present invention, the blanket tungsten layer 18 is also formed employing a low pressure chemical vapor deposition (LPCVD) method, such as to inhibit the formation of the void 20, but the void 20 will nonetheless typically form within the microelectronic fabrication whose schematic cross-sectional diagram is illustrated in FIG. 3 incident to complete filling of the partially filled via 15' from opposite sidewalls thereof towards the center thereof, under circumstances where the linewidth of the via 15 and the aspect ratio of the via 15.

Typically and preferably, the blanket tungsten layer 18 is formed to a thickness of from about 3000 to about 6000 angstroms while completely filling the partially filled via 15' (other than the void 20).

Figure 4:
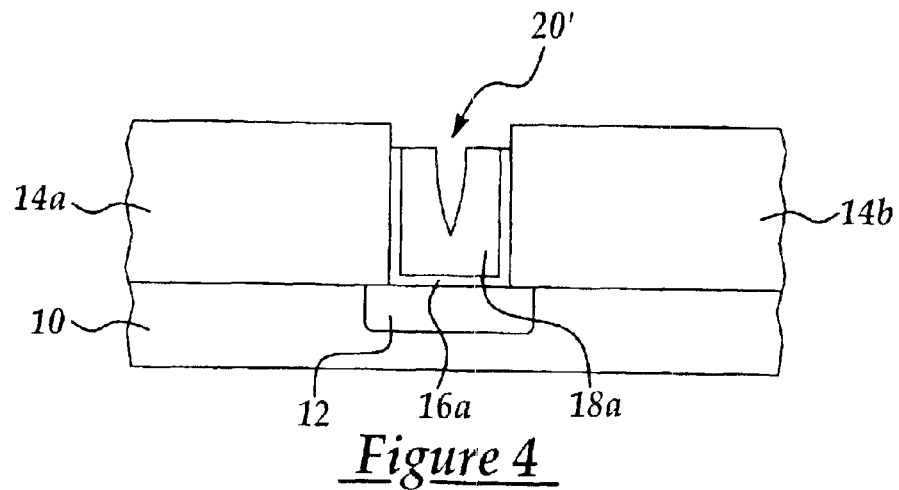

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket tungsten layer 18 and the blanket conformal liner layer 16 have been sequentially etched back to form recessed within the via 15 as illustrated within the schematic cross-sectional diagram of FIG. 1 a patterned conformal liner layer 15a having formed thereupon a tungsten stud layer 18a. In turn, the tungsten stud layer 18a has formed therein an attenuated (open ended) void 20'.

Within the preferred embodiment of the present invention, the blanket tungsten layer 18 and the blanket conformal liner layer 16 are typically and preferably sequentially etched back while employing a wet chemical etch method which in turn employs an etchant such as to provide the tungsten stud layer 18a and the patterned conformal liner layer 16a recessed beneath an upper plane of the pair of patterned dielectric layers 14a and 14b by a recess distance of from about 100 to about 1000 angstroms.

Figure 5:
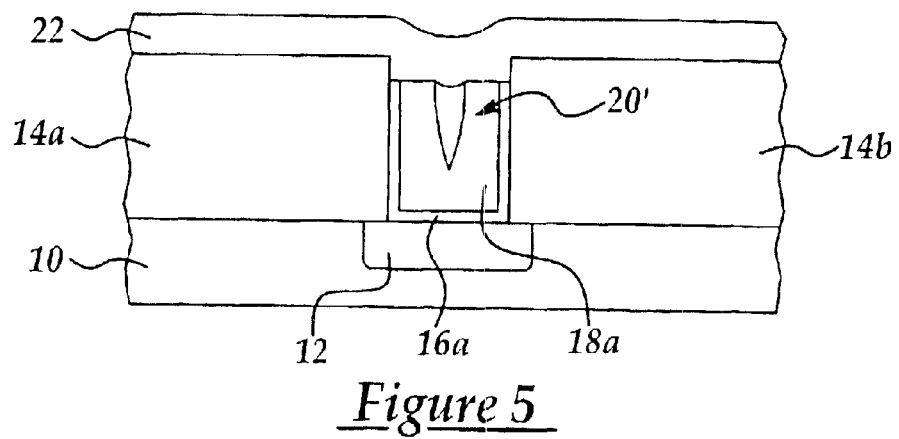

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein there is formed upon exposed portions of the pair of patterned dielectric layers 14a and 14b, the patterned conformal liner layer 16a and the tungsten stud layer 18a a blanket conductor capping layer 22 which seals the attenuated void 20'.

Within the preferred embodiment of the present invention, the blanket conductor capping layer 22 may be formed from any of several conductor capping materials as are conventional in the art of microelectronic fabrication, but preferably not a tungsten material. Such conductor capping materials may include, but are not limited to titanium, titanium nitride, tantalum, tantalum nitride and tungsten nitride capping materials. Similarly, in order to efficiently cap the tungsten stud layer 18a, the blanket conductor capping layer 22 is preferably formed employing a physical vapor deposition (PVD) method which need not necessarily fill the attenuated void 20', if in fact a void, such as the attenuated void 20' is present within a microelectronic fabrication analogous to the microelectronic fabrication whose schematic cross-sectional diagram is illustrated in FIG. 5.

Typically and preferably, the blanket conductor capping layer 22 is formed to a thickness of from about 500 to about 2000 angstroms while completely filling the recess, but sealing and not completely filling the attenuated void 20'. More typically and preferably, the blanket conductor capping layer 22 is formed of a titanium nitride material formed employing a physical vapor deposition (PVD) sputtering method, in comparison with the low pressure chemical vapor deposition (LPCVD) method which is employed for forming an analogous titanium nitride material from which is formed the patterned conductor liner layer 16a.

Figure 6:
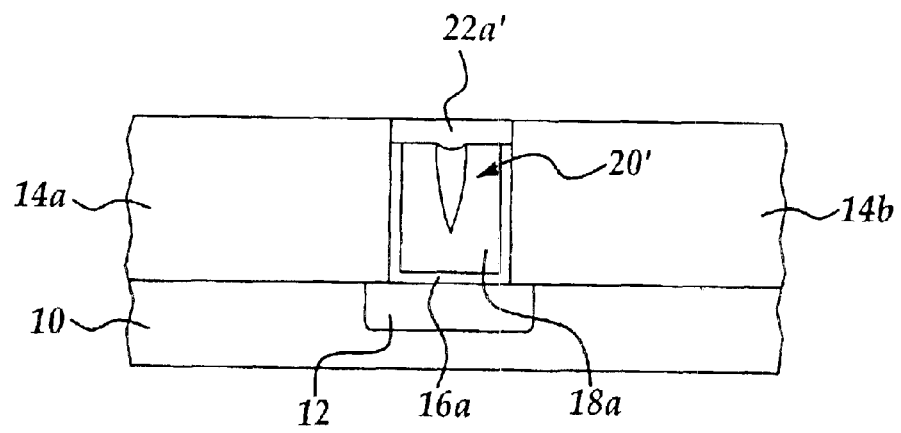

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the blanket conductor capping layer 22 has been planarized to form therefrom a patterned conductor capping layer 22a within the recess and formed upon the patterned conformal liner layer 16a and the tungsten stud layer 18a while not spanning to the pair of patterned dielectric layers 14a and 14b.

Within the preferred embodiment of the present invention the blanket conductor capping layer 22 may be planarized to form the patterned conductor capping layer 22a while employing planarizing methods as are conventional in the art of microelectronic fabrication, including in particular chemical mechanical polish (CMP) planarizing methods.

As is understood by a person skilled in the art, and insofar as the preferred embodiment of the present invention is directed towards a tungsten stud layer with enhanced reliability but generally having a void or a seam enclosed therein, the preferred embodiment of the present invention provides particular value under circumstances where a microelectronic fabrication within which is employed the substrate 10 having formed thereover the tungsten stud layer 18a having the void or seam enclosed therein does not provide a particularly high current density through the tungsten stud layer 18a. Such microelectronic fabrications are typically and preferably optoelectronic microelectronic fabrications, such as but not limited to display image array optoelectronic microelectronic fabrications, which may generally provide for a reduced current density within a tungsten stud layer.

As is understood by a person skilled in the art, the preferred embodiment of the present invention is illustrative of the present invention rather than limiting of the present invention. Revisions and modifications may be made to methods, materials, structures and dimensions employed for forming a microelectronic fabrication in accord with the preferred embodiment of the present invention while still providing a microelectronic fabrication in accord with the present invention, further in accord with the accompanying claims.

What is claimed is:

1. A method for forming a microelectronic fabrication comprising:

providing a substrate;

forming upon the substrate a patterned dielectric layer which defines a via;

forming over the substrate and filling the via a blanket tungsten layer having formed therein a void;

etching back the blanket tungsten layer to form recessed within the via a tungsten stud layer having formed therein the void;

forming over the substrate and filling a recess above the tungsten stud layer while sealing the void a blanket conductor capping layer formed of a conductor material other than tungsten; and planarizing the blanket conductor capping layer to form within the recess within the via a patterned conductor capping layer formed upon the tungsten stud layer and sealing the void.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein:

the via has a linewidth of from about 0.15 to about 0.5 microns; and the recess has a depth of from about 100 to about 1000 angstroms.

4. The method of claim 1 wherein the blanket conductor capping layer is formed from a conductor material selected from the group consisting of titanium, titanium nitride, tantalum, tantalum nitride and tungsten nitride conductor materials.

5. The method of claim 1 wherein the patterned conductor capping layer seals the void within the tungsten stud layer while not filling the void within the tungsten stud layer.

6. A microelectronic fabrication comprising:

a substrate;

a patterned dielectric layer formed over the substrate, the patterned dielectric layer defining a via;

a tungsten stud layer formed into a lower portion of the via and recessed beneath an upper plane of the patterned dielectric layer, the tungsten stud layer having formed therein a void;

a patterned conductor capping layer filled into the recess and sealing but not filling the void while also not spanning over the patterned dielectric layer, the patterned conductor capping layer being formed of a conductor material other than tungsten.

7. The microelectronic fabrication of claim 6 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

8. The microelectronic fabrication of claim 6 wherein:

the via has a linewidth of from about 0.15 to about 0.5 microns; and the recess has a depth of from about 100 to about 1000 angstroms.

9. The microelectronic fabrication of claim 6 wherein the blanket conductor capping layer is formed from a conductor material selected from the group consisting of titanium, titanium nitride, tantalum, tantalum nitride and tungsten nitride conductor materials.

* * * * *